United States Patent
Huang et al.

(10) Patent No.: US 6,747,588 B1
(45) Date of Patent: Jun. 8, 2004

(54) METHOD FOR IMPROVING SUCCESSIVE APPROXIMATION ANALOG-TO-DIGITAL CONVERTER

(75) Inventors: Jia-Jio Huang, Hsin-Chu (TW); Yi-Ping Lin, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/248,375

(22) Filed: Jan. 15, 2003

(51) Int. Cl.$^7$ .............................. H03M 1/12; H03M 1/66
(52) U.S. Cl. ......................................... 341/156; 341/145
(58) Field of Search ............................... 341/155, 156, 341/145, 118, 120, 141, 154

(56) References Cited

U.S. PATENT DOCUMENTS 5,218,362 A * 6/1993 Mayes et al. ............... 341/121
5,287,108 A * 2/1994 Mayes et al. ............... 341/156
6,611,222 B1 * 8/2003 Murphy ...................... 341/155

* cited by examiner

*Primary Examiner*—Patrick Wamsley
(74) *Attorney, Agent, or Firm*—Winston Hsu

(57) ABSTRACT

A successive approximation analog-to-digital converter is used for converting an analog input signal into a corresponding digital output signal. The successive approximation analog-to-digital converter has a successive approximation register for storing a first digital bit stream and a second digital bit stream that are related to the analog input signal, and a digital-to-analog converter for generating a first reference voltage and a second reference voltage according to the first and second digital bit streams. The digital-to-analog converter has a first voltage divider and a second voltage divider. The first voltage divider drives the first reference voltage approaching the analog input signal to establish the first digital bit stream, and the second voltage divider drives the second reference voltage approaching the analog input signal to establish the second digital bit stream. Finally, the first and second digital bit streams are averaged to generate the digital output signal.

9 Claims, 5 Drawing Sheets

METHOD FOR IMPROVING SUCCESSIVE APPROXIMATION ANALOG-TO-DIGITAL CONVERTER

BACKGROUND OF INVENTION

1. Field of the Invention

The present invention relates to a method of signal transformation for successive approximation for an analog-to-digital converter, and more specifically, to a method with increased resolution.

2. Description of the Prior Art

Recently, thanks to developments in computers, the world is entering the digital era. Videotapes, audiotapes and other analog data storage media are being gradually replaced by digital storage media, such as optical disks. Digital data can be processed by a computer system directly, so the application is more convenient. Generally speaking, analog signals require an analog-to-digital converter (ADC) to be transformed into digital signals. The most common ADC construction includes flash ADC, pipeline ADC and successive approximation ADC. Although flash ADC and pipeline ADC are faster than successive approximation ADC, their electricity consumption is also larger, and are not suitable for many systems with limited power supply.

Please refer to FIG. 1. FIG. 1 is a functional block diagram of a prior art successive approximation ADC 10. The successive approximation ADC 10 comprises a comparator 12, a control logic circuit 13, a successive approximation register (SAR) 14, and a digital-to-analog converter (DAC) 16. The successive approximation register 14 comprises a digital bit stream 18 having a plurality of bits, such as a most significant bit (MSB) 20 and a least significant bit (LSB) 22. The successive approximation register 14 referencing the digital value 18 will output a digital signal 24 to the DAC 16, and then the DAC 16 will transform the digital signal 24 into an analog reference signal 26. The comparator 12 will compare the analog reference signal 26 and an analog input signal 28 to form a comparison result 30. For instance, if the analog reference signal 26 is larger than the analog input signal 28, the comparison result 30 will be binary value "0". On the contrary, if the analog reference signal 26 is smaller than the analog input signal 28, the comparison result 30 will be binary value "1". The control logic circuit 13 based on the comparison result 30 adjusts the digital value 18 stored in the successive approximation register 14 accordingly. As the digital value 18 changes, the digital signal 24 will also change and further influence the magnitude of the output analog reference signal 26 from the DAC 16. This process will continue until the analog reference signal 26 approximates the analog input signal 28 and the least significant bit 22 of digital value 18 is set.

Please refer to FIG. 2 and FIG. 3. FIG. 2 is a block diagram of the DAC 16 shown in FIG. 1. FIG. 3 is a voltage level diagram of the analog reference signal 26 shown in FIG. 1 The DAC 16 comprises a plurality of switches 34a–d, a plurality of first resistors 36 and a plurality of second resistors 38. The resistance value (2R) of each first resistor 36 is twice the resistance value (R) of each second resistor 38, and the method of electronic connection for the first resistor 36 and the second resistor 38 is a ladder-like architecture used as a voltage divider. Each switch 34 is used to select the voltage input for each first resistor 36, such as a ground (GND) or an operational voltage (Vdd). In addition, every switch 34 maps to a corresponding bit of the digital value 18, and if a bit has a binary value "1" in it, the corresponding switch 34 selects operational voltage Vdd. However, if a bit has a binary value "0" in it, the corresponding switch 34 selects ground GND. Please note, for easier illustration, FIG. 3 only shows four switches 34a–d, and it is assumed that the bit length of digital value 18 is 4. Among them, switch 34a maps to most significant bit 20, while switch 34d maps to the least significant bit 22. A voltage level of output terminal A from the DAC 16 changes according to the voltage (Vdd or GND) at every switch 34. If the digital value 18 is "1000", switch 34a will connect to Vdd, while switches 34b, 34c, and 34d will all connect to GND. From the voltage divider circuit formed by resistors 36 and 38, we know the voltage level of output terminal A is ½*Vdd. Similarly, if the digital value 18 is "0100", the voltage level of the output terminal A is ¼*Vdd. If the digital value 18 is "0001", the voltage level of output terminal A is ⅛*Vdd. If digital value 18 is "0000", the voltage level of output terminal A is ¹⁄₁₆*Vdd. So if D3, D2, D1 and D0 represent digital values 18 from the most significant bit to the least significant bit respectively, by the superposition principle, we can conclude the following relationship between the voltage level Va of output terminal A and the digital value 18:

$$Va = (½*D3 + ¼*D2 + ⅛*D1 + ¹⁄₁₆*D0)*(Vdd - GND)$$

By changing the bit value of digital value 18, one can further adjust voltage level Va (the reference signal 26 shown in FIG. 1) at output terminal A of the DAC 16. When the successive approximation ADC 10 starts operation, the successive approximation register 14 will set the most significant bit D3 of the digital value 18 to be "1", and the other bits D2~D0 to be "0".That is, the initial value of the digital value 18 is "1000". So during a first pulse 40a, the voltage level of the analog reference signal 26 is ½*Vdd, as shown in FIG. 3. The voltage level of the analog input signal 28 is greater than the analog reference signal 26, so comparator 12 will transfer the result of comparison 30 into the successive approximation register 14. Because the voltage level of analog reference signal 26 is smaller than analog input signal 28, the successive approximation register 14 keeps the "1" in the most significant bit D3, and sets the next bit D2 to "1". Now the digital value 18 is "1100". So during a second pulse 40b, the voltage level of the analog reference signal 26 is (½+¼)*Vdd. But, the voltage level of the analog input signal 28 is smaller than the analog reference signal 26, so the comparator 12 will transfer the results of comparison 30 into the successive approximation register 14. The successive approximation register 14 will reset bit D2 to "0", and set the next bit D1 to "1", now the digital value 18 is "1010". During a third pulse 40c, the voltage level of the analog reference signal 26 is (½+⅛)*Vdd, and the voltage level of the analog input signal 28 is greater than the analog reference signal 26, so the comparator 12 will transfer the result of comparison 30 into the successive approximation register 14. As described, the successive approximation register 14 keeps the "1" in bit D1, and sets the next bit to "1", and the digital value 18 becomes "1011". Finally, during the fourth pulse 40c, the voltage level of the analog reference signal 26 is (½+⅛+¹⁄₁₆)*Vdd, and the voltage level of the analog input signal 28 is greater than the analog reference signal 26, so the comparator 12 transfers the result of comparison 30 into the successive approximation register 14. As described, the successive approximation register 14 keeps the "1" in bit D0. Since bit D0 is the least significant bit, the successive approximation ADC 10 is finished one signal transformation process, that is, the analog input signal 28 is finally transformed into digital output signal 32 shown in FIG. 1 ("1011").

As described above, the successive approximation ADC 10 use the prior art binary search algorithm to detect voltage levels of the analog input signal 28 to produce the digital output signal 32. For a successive approximation ADC 10 to transform an analog input signal 28 into a 4-bit digital output signal 32, the smallest output quantity value that the DAC 16 can produce is 1/16*Vdd, this being the resolution of the successive approximation ADC 10. If the successive approximation register 14 uses more bits (e.g. 10 bits) for the digital value 18, this relatively improves the resolution of the successive approximation ADC 10 (e.g. 1/1024*Vdd) allowing measurement of the analog input signal 28 with better accuracy producing a more accurate output signal 32. In general, the successive approximation ADC 10 is an integrated circuit (IC), produced by semiconductor processes. Normally, it will incorporate one conductor layer or impurity doped layer to form a resistor component, such resistor component being influenced by the process and having an error between the actual resistance and ideal value. That is, there cannot be a completely accurate predefined ratio (2:1) of the resistances of resistors 36 and 38. Because the DAC 16 uses voltage divider architecture formed by resistors 36 and 38 to produce matching voltage levels by the binary search method, the error of each resistance further influences the least quantified value of the DAC 16, i.e. the resolution. Thus, when the DAC 16 uses the binary search to compare the voltage level of the input signal 28 to the analog reference signal 26, the inaccurate analog reference signal 26 causes errors from the ideal value in the actual digital output signal 32.

SUMMARY OF INVENTION

It is the primary objective of the claimed invention to provide a signal transformation method for a successive approximation ADC to improve resolution to solve the problems described above.

Briefly summarized, the claimed invention provides a method of signal transformation in an analog-to-digital converter (ADC). The ADC is used to transform an analog input signal to a digital output signal. The ADC comprises a successive approximation register (SAR) to store a digital value with a predetermined bit length, and one digital-to-analog converter (DAC). The ADC further comprises a first voltage divider unit with an input terminal electrically connected to a first predetermined voltage, a second voltage divider unit with an input terminal electrically connected to the first predetermined voltage, and a third voltage divider unit. The first voltage divider unit comprises a first resistor that is used to approach a first resistance, and a first switch that Is electrically connected to the first resistor for controlling whether the output terminal of the first voltage divider unit is electrically connected to the input terminal. The second voltage divider unit comprises a second resistor that is used to approach the first resistance, and a second switch that is electrically connected to the second resistor for controlling whether the output terminal of the second voltage divider unit is electrically connected to the input terminal. The third voltage divider unit comprises a plurality of third resistors, each having a resistance approaching the first resistance value; a plurality of fourth resistors connected in series between the output end of the first voltage divider unit and the output end of the second voltage divider unit, each fourth resistor having a resistance approaching a second resistance value and both ends of each fourth resistor connected to two adjacent third resistors; and a plurality of control switches. Each control switch comprisesa third switch connected between a third resistor and the first predetermined voltage and a fourth switch connected between a third resistor and a second predetermined voltage. The signal converting method comprises controlling the first switch and the second switch to electrically connect the first voltage divider unit to the first predetermined voltage and to disconnect the second voltage divider unit from the first predetermined voltage, controlling the plurality of control switches for the output end of the second divider unit generating a first voltage approaching the analog input signal, and controlling the successive approximation register generating a first digital bit stream according to the first voltage. The method further comprises controlling the first switch and the second switch to disconnect the first voltage divider unit from the first predetermined voltage and to electrically connect the second voltage divider unit to the first predetermined voltage, controlling the plurality of control switches for the output end of the first divider unit generating a second voltage approaching the analog input signal, and controlling the successive approximation register generating a second digital bit stream according to the second voltage. The method finally comprises computing an average of the first digital bit stream and the second digital bit stream to generate the digital output signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
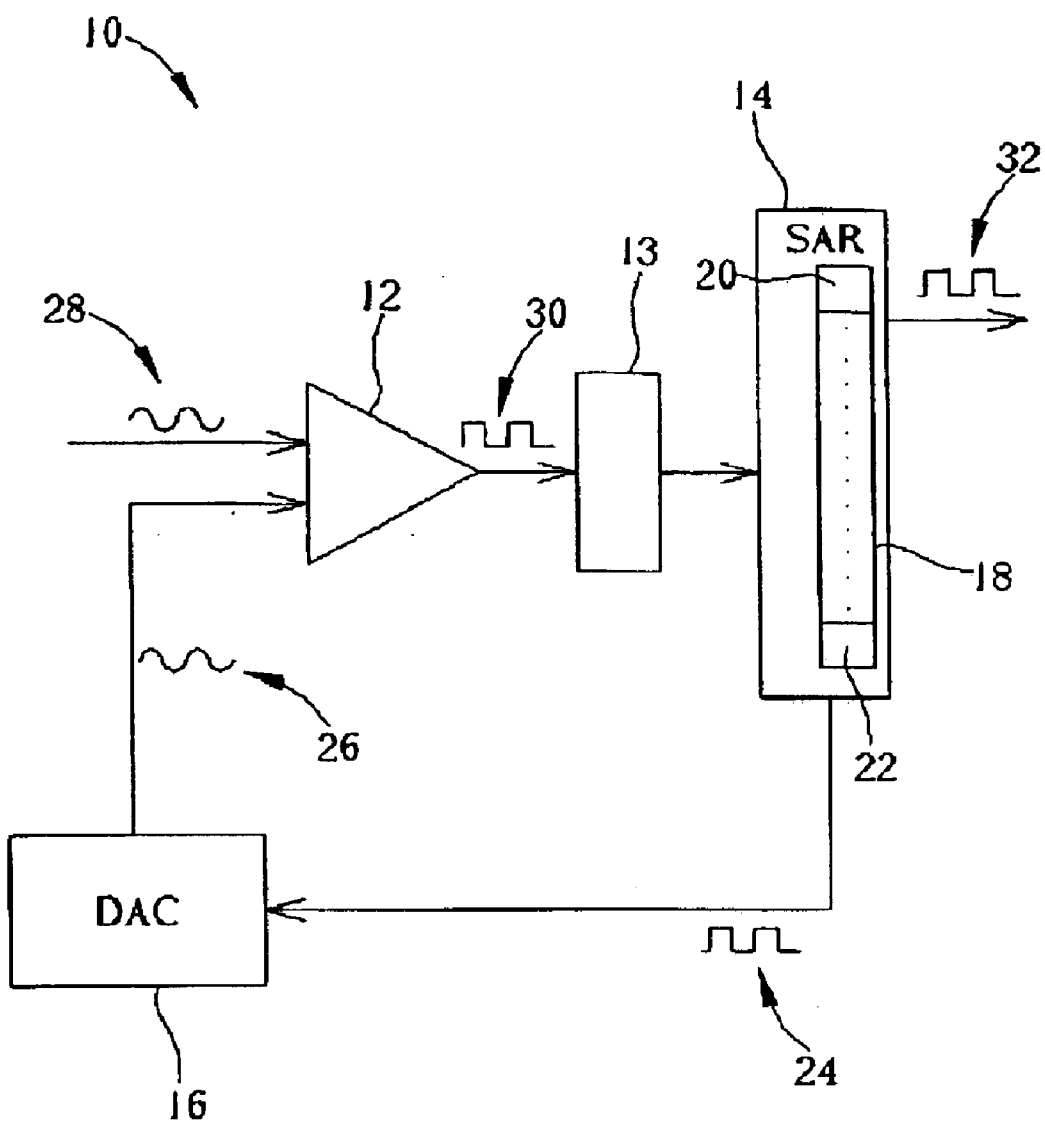
FIG. 1 is a functional block diagram of a prior art successive approximation ADC.
Figure 2:
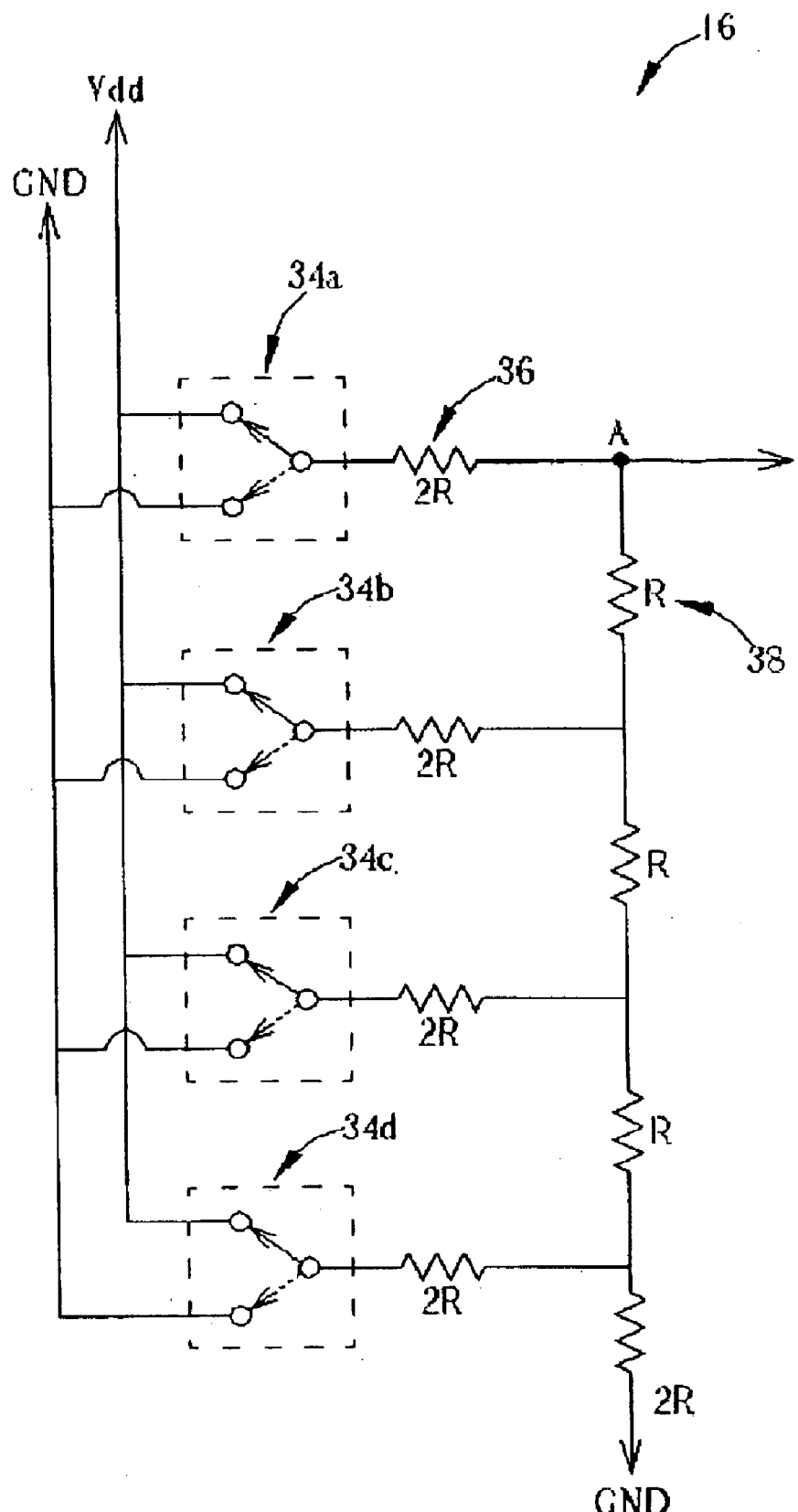
FIG. 2 is a functional block diagram of the DAC shown in FIG. 1.
Figure 3:
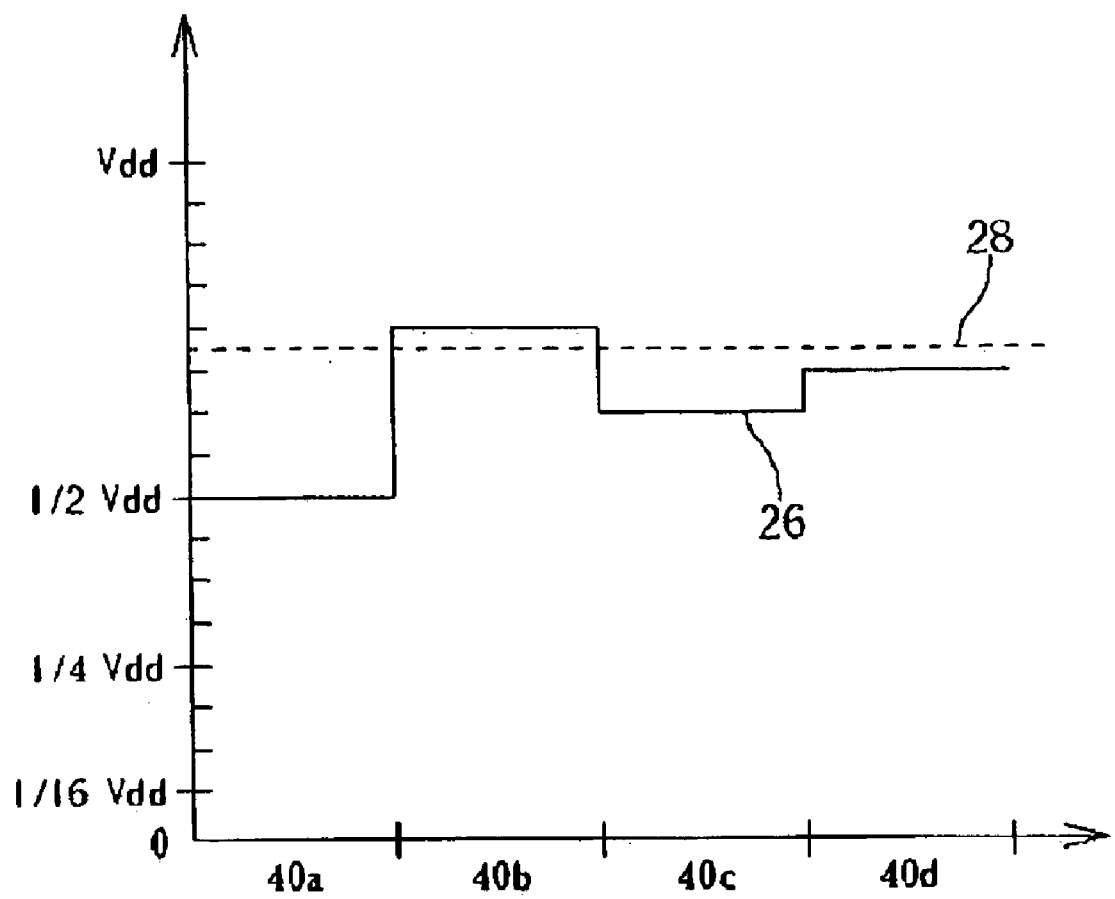
FIG. 3 is a voltage level diagram of the analog signal shown in FIG. 1.
Figure 4:
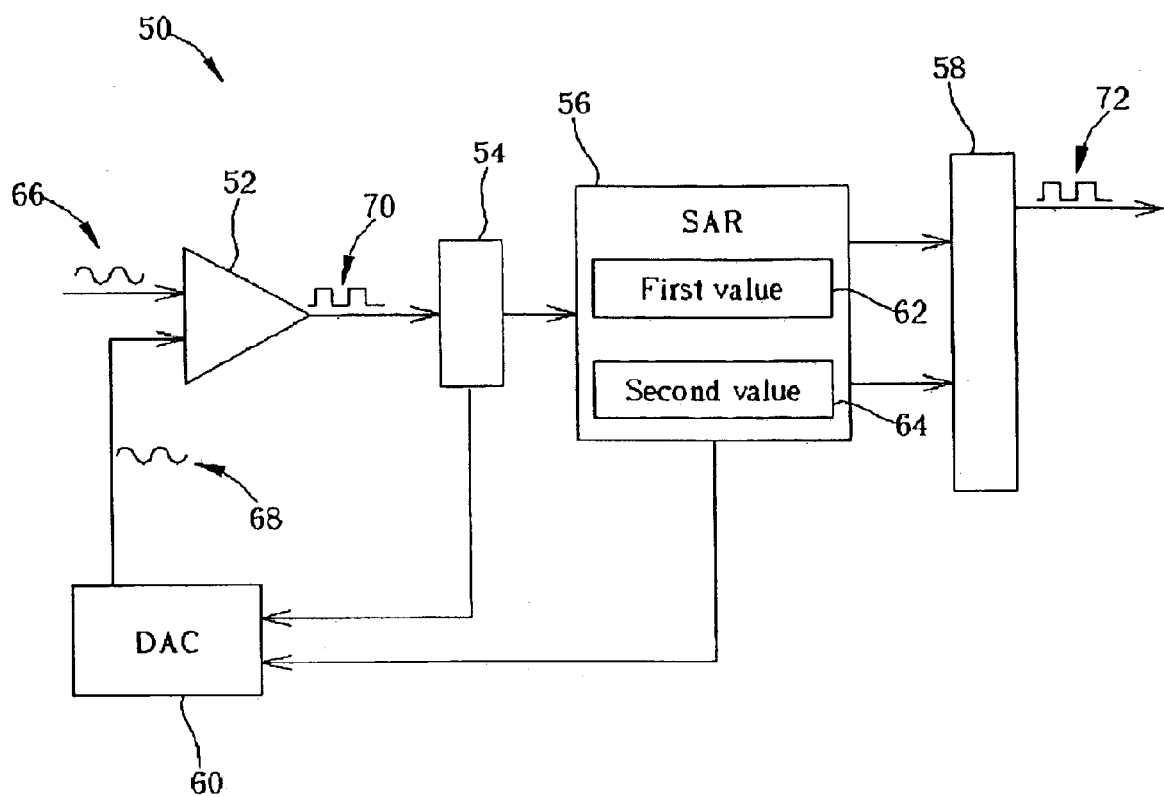
FIG. 4 is a functional block diagram of the present invention successive approximation ADC.

Please refer to FIG. 4. FIG. 4 is a functional block diagram of the present invention successive approximation ADC 50. The successive approximation ADC 50 comprises a comparator 52, a control logic circuit 54, a successive approximation register 56, a logic computing module 58, and a DAC 60. The successive approximation register 56 comprises a first digital value 62 and a second digital value 64. The comparator 52 is used to compare an analog input signal 66 with an analog reference signal 68, and output a relative comparison result 70 to the successive approximation register 56. The successive approximation register 56 adjusts and updates the first and second digital values 62 and 64 according to the comparison result 70. In the preferred embodiment, the successive approximation ADC 50 performs two signal conversions on analog input data 66, The digital conversion results are stored in the first and second digital value 62 and 64 respectively. The successive approximation ADC 50 then transfers the first and second digital values 62, 64 to the logic computing module 58. The logic computing module 58 computes an average of the first digital value 62 and the second digital value 64, that is, the logic computing module 58 performs addition on the first digital value 62 and the second digital value 64, and then uses a prior art bit shift logic operation to divide the sum of digital values 62 and 64 in half. This average is the corresponding digital output signal 72 of the analog input signal 66.

Figure 5:
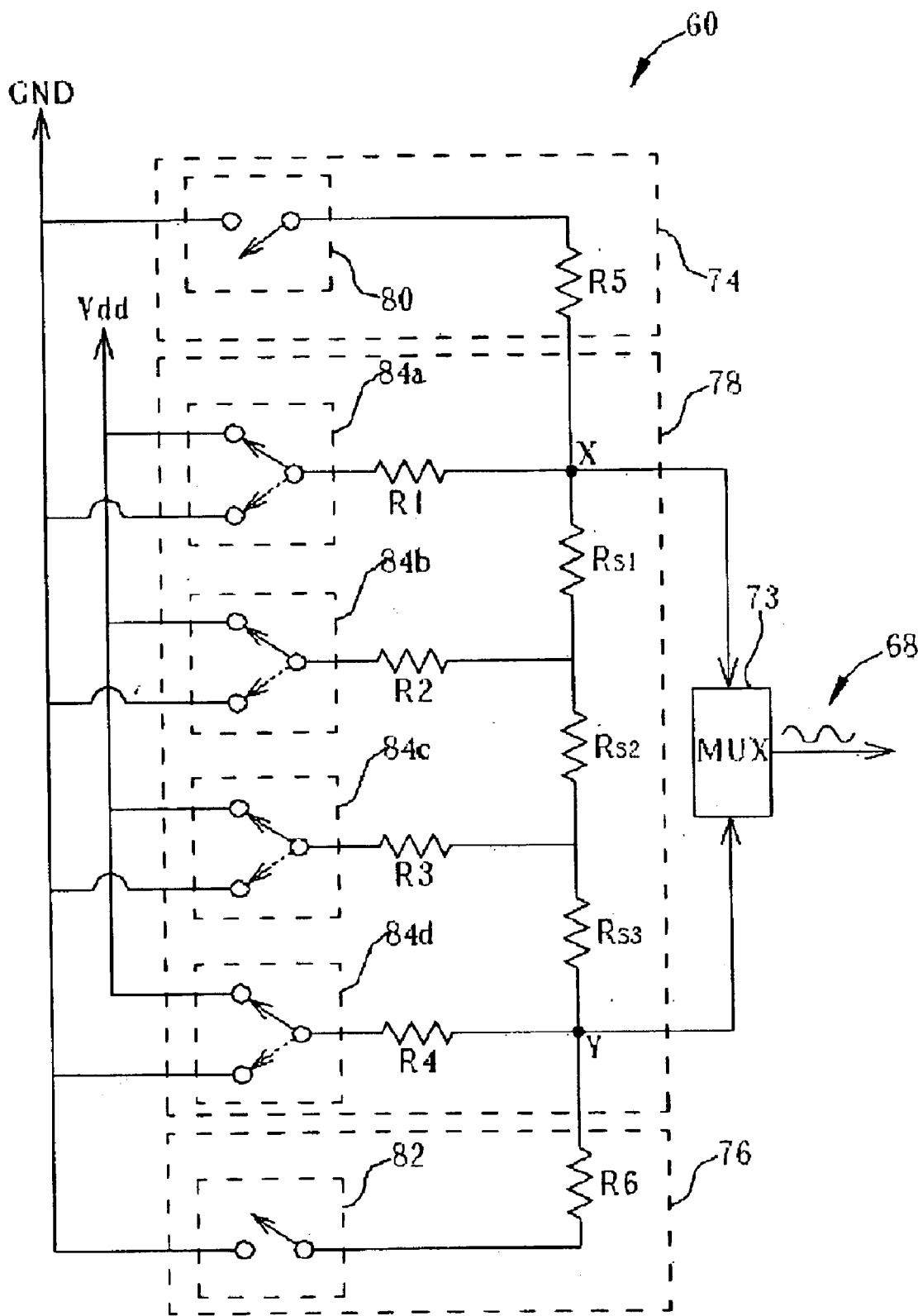
FIG. 5 is a functional block diagram of the DAC shown in FIG. 4.

Please refer to FIG. 5. FIG. 5 is a block diagram of the DAC 60 shown on FIG. 4. The DAC 60 comprises a multiplexer/selector 73, a first voltage divider unit 74, a second voltage divider unit 76, and a third voltage divider 78 The first voltage divider unit 74 comprises a resistor R5 and a switch 80, and second voltage divider 76 comprises a resistor R6 and a switch 82. The switches 80, 82 are used to control whether the first voltage divider unit 74 and the second voltage divider unit 76 are connected to ground GND. The third voltage divider unit 78 comprises a plurality of resistors R1 R2, R3, R4, Rs1, Rs2, and Rs3 and a plurality of switches 84a, 84b, 84c, and 84d. Please note, for description purposes, the preferred embodiment only uses 4 switches 84a–d in demonstration (that is, the first and second digital values 62 and 64 have 4 digits). But actually, the bit lengths of the first and second digital value 62 and 64 of the successive approximation register 56 are used to set up switches 84 accordingly.

The operational principle of the present invention is described as follows. First, the control logic circuit 54 controls the DAC 60 to disable the switch 80 of the first voltage divider unit 74 to form an open circuit, and enable the switch 82 of the second voltage divider unit 76 to electrically connect to ground GND. Thus, the DAC 60 is equivalent to the divider circuit formed by the second divider unit 76 and the third divider unit 78. In addition, the control logic circuit 54 controls multiplexer/selector 73 to choose the output voltage of terminal X, that is, the output voltage of terminal X is used as the analog reference signal 68 of the DAC 60 input to the comparator 52. Switches 84a, 84b, 84c, and 84d are sequentially mapped to bits of first digital value 62. The most significant bit maps to switch 84a, and the least significant bit maps to switch 84d. So, based on the prior binary search method, we can get the first digital value 62 of the corresponding analog input signal 66. Then, control logic circuit 54 controls the DAC 60 to disable the switch 82 of the second voltage divider unit 76 to form an open circuit, and enable the switch 80 of the first voltage divider unit 74 to electrically connect to ground GND. Thus, the DAC 60 is equivalent to the divider circuit formed by first divider unit 74 and third divider unit 78. In addition, the control logic circuit 54 controls multiplexer/selector 73 to choose the output voltage of terminal Y, that is, the output voltage of terminal Y is used as the analog reference signal 68 of the DAC 60 input to the comparator 52. The switches 84a, 84b, 84c, and 84d are sequentially mapped to bits of the second digital value 64. The most significant bit maps to switch 84d, and the least significant bit maps to switch 84a. So, based on the prior binary search method, we can get the second digital value 64 of the corresponding analog input signal 66. Please note, because the divider circuit formed by first divider unit 74 and third divider unit 78, and the divider circuit formed by the second divider unit 76 and third divider unit 78 have symmetric circuit structure from top to bottom, the sequence mapping of switches 84 and second digital value 64 to the sequence mapping of switches 84 and first digital value 62 are likewise reversed. The multiplexer/selector 73 selects the voltage level from the terminal Y and the terminal X respectively for reference analog signal 68.

In an ideal situation, the resistance of resistors Rs1, Rs2, and Rs3 should be half of the resistance of resistors R1, R2, R3, R4, and R5. However, affected by semiconductor manufacturing processes, each resistor has an error in resistance. Thus, the resistances of resistors Rs1, Rs2, and Rs3 do not precisely match with the resistances of resistors R1, R2, R3, R4, R5, and R6 with a predetermined ratio (1:2). Therefore, the analog reference signal 68 will deviate from an ideal value causing errors in the digital values 62, 64. If D3, D3, D1, and D0 represent the most significant bit to the least significant bit of the first digital value 62 respectively, the relation of voltage level on terminal X (Vx) to the first digital value 62 is:

$$Vx=(K13*D3+K12*D2+K11*D1+K10*D0)*(Vdd-GND)$$

If D3, D3, D1, and D0 represent the most significant bit to the least significant bit of the second digital value 64 respectively, the relation of voltage level on terminal Y (Vy) to the second digital value 64 is:

$$Vy=(K23*D3+K22*D2+K21*D1+K20*D0)*(Vdd-CND)$$

Wherein the ideal values of K13, K12, K11, and K10 are ½, ¼, ⅛ and ¹⁄₁₆ respectively; and the ideal values of K23, K22, K21, and K20 are ½, ¼, ⅛ and ¹⁄₁₆ respectively.

The first digital value 62 corresponds to the divider circuit formed by the second divider unit 76 and the third divider unit 78. And the second digital value 64 corresponds to the divider circuit formed by the first divider unit 74 and the third divider unit 78. In the preferred embodiment, the third divider unit 78 is used by the corresponding divider circuit of the first digital value 62 and the second digital value 64, and the third divider unit 78 is the main part of the divider circuit. However, the resistors R1, R2, R3, R4, Rs1, Rs2, and Rs3 of the third divider unit 78 each have different influences on the corresponding divider circuit of the first and second digital values 62, 64. Finally, when the logic computing module 58 performs the average computing process on the first and second digital values 62, 64, the errors of the first and second digital values 62, 64 that are caused by the mismatch of resistors (caused by the semiconductor process) of the DAC 60 will be minimized, because of the averaging computing process.

Analog reference signal 68={[(K13+K23)/2]*D3+[(K12+K22)/2]*D2+[(K11+K21)/2*D1]+[(K10+K20)/2]*D0}}*(Vdd−GND)

In other words, the resistances of the original resistors Rs1, Rs2, and Rs3 and the resistances of the resistors R1, R2, R3, R4, R5, and R6 do not match with the predetermined ratio (1:2), so coefficients K13, K23, K12, K22, K11, K21, K10, and K20 deviate from the ideal values (e.g. ½, ¼, ⅛ and ¹⁄₁₆). However, averaging the first and second digital values 62, 64 can improve voltage levels of the reference signal 68 equally, and make the analog reference signal 68 approach analog input signal 66 with more accuracy, and improve the effect caused by the mismatched resistors. Thus, the corresponding analog input signal 66 and the digital output signal 72 will be closer to their ideal values.

Compared to the prior art, the present invention successive approximation ADC 50 uses a successive approximation register 56 and a DAC 60 to perform two signal conversions on one analog input signal. The DAC 60 uses two symmetrically constructed divider circuits to perform these two signal conversions. Finally, it uses one logic computing module 58 to average the two digital values from the two signal conversions to create the digital output signal corresponding to the analog input signal. This reduces the detrimental effect caused by mismatched resistors in the divider circuits, so the digital output signal and the resolution are closer to the ideal values. In addition, the present invention successive approximation ADC 50 only adds one resistor to achieve two symmetric divider circuits, so the circuit structure is simple and the cost is relatively low. Furthermore the averaging of two digital values can be easily accomplished by a simple logic operation, so the present invention successive approximation ADC not only has improved resolution but the circuit has a simple implementation.

Described above is only the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A signal converting method for an analog-to-digital converter (ADC) that is used for converting an analog input signal into a digital output signal, the analog-to-digital converter comprising:
   a successive approximation register (SAR) for storing a digital bit stream of predetermined bit length;
   a digital-to-analog converter (DAC) comprising:
      a first voltage divider unit having an input end electrically connected to a first predetermined voltage, the first voltage divider unit comprising:
         a first resistor having a resistance approaching a first resistance value; and
         a first switch electrically connected to the first resistor for controlling if an output end of the first divider unit electrically connects to the input end;
      a second voltage divider unit having an input end electrically connected to the first predetermined voltage, the second voltage divider unit comprising:
         a second resistor having a resistance approaching the first resistance value; and
         a second switch electrically connected to the second resistor for controlling if an output end of the second divider unit electrically connects to the input end;
      a third voltage divider unit comprising:
         a plurality of third resistors, each having a resistance approaching the first resistance value;
         a plurality of fourth resistors connected in series between the output end of the first voltage divider unit and the output end of the second divider unit, each fourth resistor having a resistance approaching a second resistance value and both ends of each fourth resistor connected to two adjacent third resistors; and
         a plurality of control switches, each control switch comprising:
            a third switch connected between a third resistor and the first predetermined voltage; and
            a fourth switch connected between a third resistor and a second predetermined voltage;
   the signal converting method comprising:
      controlling the first switch and the second switch to electrically connect the first voltage divider unit to the first predetermined voltage, and to disconnect the second voltage divider unit from the first predetermined voltage, and controlling the plurality of control switches for the output end of the second divider unit generating a first voltage approaching the analog input signal, and controlling the successive approximation register generating a first digital bit stream according to the first voltage;
      controlling the first switch and the second switch to disconnect the first voltage divider unit from the first predetermined voltage, and to electrically connect the second voltage divider unit to the first predetermined voltage, and controlling the plurality of control switches for the output end of the first divider unit generating a second voltage approaching the analog input signal, and controlling the successive approximation register generating a second digital bit stream according to the second voltage;
      computing an average of the first digital bit stream and the second digital bit stream to generate the digital output signal.

2. The signal converting method of claim 1 wherein if the plurality of control switches generates the first digital bit stream according to priority respectively from a most significant bit (MSB) of the first digital bit stream to a least significant bit (LSB) of the first digital bit stream, the plurality of control switches generates the second digital bit stream according to priority respectively from the most significant bit of the second digital bit stream to the least significant bit of the second digital bit stream.

3. The signal converting method of claim 2 wherein when a bit of the first and second digital bit stream has a first predetermined value, the third switch of the control switch corresponding to the bit makes the corresponding third resistor connect to the first predetermined voltage, and the fourth switch of the control switch corresponding to the bit disconnects the corresponding third resistor from the second predetermined voltage; and when a bit of the first and second digital bit stream has a second predetermined value, the third switch of the control switch corresponding to the bit disconnects the corresponding third resistor from the first predetermined voltage, and the fourth switch of the control switch corresponding to the bit makes the corresponding third resistor connect to the second predetermined voltage.

4. The signal converting method of claim 1 wherein the analog-to-digital converter further comprises:
   a comparator electrically connected between the analog input signal and the output ends of the first and second divider units for comparing voltages of the output ends of the first and second divider units and values of the analog input signal; and
   a control logic electrically connected to the successive approximation register for updating the first and second digital bit streams of the successive approximation register according to comparative results of the comparator.

5. The signal converting method of claim 4 wherein the control logic operates according to a method of successive approximation updating each bit in turn from the most significant bit of the digital, bit stream to the least significant bit of the digital bit stream until finished.

6. The signal converting method of claim 1 wherein the first resistance value is approximately twice as large as the second resistance value.

7. The signal converting method of claim 1 wherein a quantity of control switches of the plurality of control switches of the third divider unit is equal to the bit length of the digital bit stream of the successive approximation register.

8. The signal converting method of claim 1 wherein a voltage difference between the first and second predetermined voltages is a range of the analog input signal processed by the analog-to-digital converter.

9. The signal converting method of claim 1 wherein the analog-to-digital converter further comprises a logical operation module electrically connected to the successive approximation register for computing the average of the first and second digital bit streams.

* * * * *